United States Patent
Koshimizu et al.

(10) Patent No.: US 7,956,310 B2
(45) Date of Patent: Jun. 7, 2011

(54) STAGE, SUBSTRATE PROCESSING APPARATUS, PLASMA PROCESSING APPARATUS, CONTROL METHOD FOR STAGE, CONTROL METHOD FOR PLASMA PROCESSING APPARATUS, AND STORAGE MEDIA

(75) Inventors: Chishio Koshimizu, Nirasaki (JP); Tomohiro Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1286 days.

(21) Appl. No.: 11/529,390

(22) Filed: Sep. 29, 2006

(65) Prior Publication Data
US 2007/0084847 A1    Apr. 19, 2007

Related U.S. Application Data

(60) Provisional application No. 60/731,283, filed on Oct. 31, 2005.

(30) Foreign Application Priority Data

Sep. 30, 2005 (JP) .................................. 2005-288355
Sep. 14, 2006 (JP) .................................. 2006-249485

(51) Int. Cl.
*B23K 10/00* (2006.01)

(52) U.S. Cl. ............... 219/497; 219/121.43; 219/121.48; 118/725; 392/418

(58) Field of Classification Search ............... 219/121.4, 219/121.48, 121.43, 121.44; 118/723 R, 118/724, 725, 728; 392/416–418
See application file for complete search history.

(56) References Cited

U.S. PATENT DOCUMENTS

| | | | |
|---|---|---|---|
| 6,325,948 B1 | 12/2001 | Chen et al. | |
| 6,353,210 B1 * | 3/2002 | Norrbakhsh et al. | 219/497 |
| 7,274,004 B2 * | 9/2007 | Benjamin et al. | 219/444.1 |
| 7,603,028 B2 * | 10/2009 | Yassour et al. | 392/477 |
| 2005/0172904 A1 | 8/2005 | Koshimizu et al. | |

* cited by examiner

*Primary Examiner* — Mark H Paschall
(74) *Attorney, Agent, or Firm* — Oblon, Spivak, McClelland, Maier & Neustadt, L.L.P.

(57) ABSTRACT

A stage onto which is electrostatically attracted a substrate to be processed in a substrate processing apparatus, which enables the semiconductor device yield to be improved. A temperature measuring apparatus 200 measures a temperature of the substrate to be processed. A temperature control unit 400 carries out temperature adjustment on the substrate to be processed such as to become equal to a target temperature based on a preset parameter. A temperature control unit 400 controls the temperature of the substrate to be processed by controlling the temperature adjustment by the temperature control unit 400 based on a measured temperature measured by the temperature measuring apparatus 200.

15 Claims, 8 Drawing Sheets

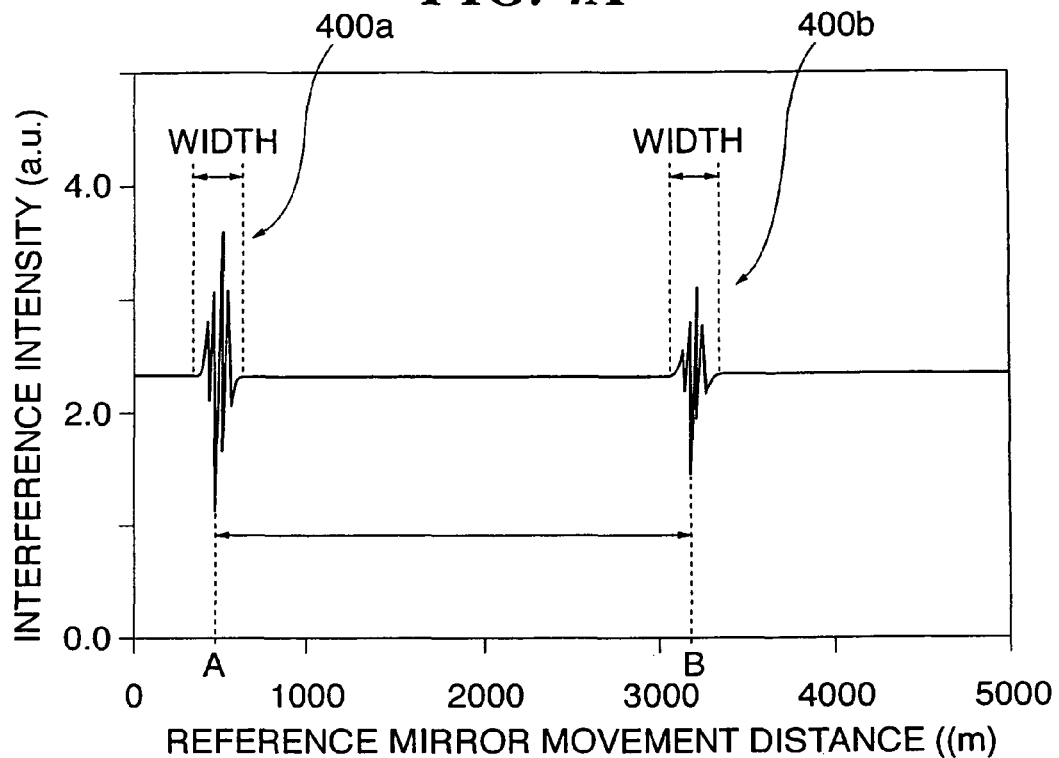
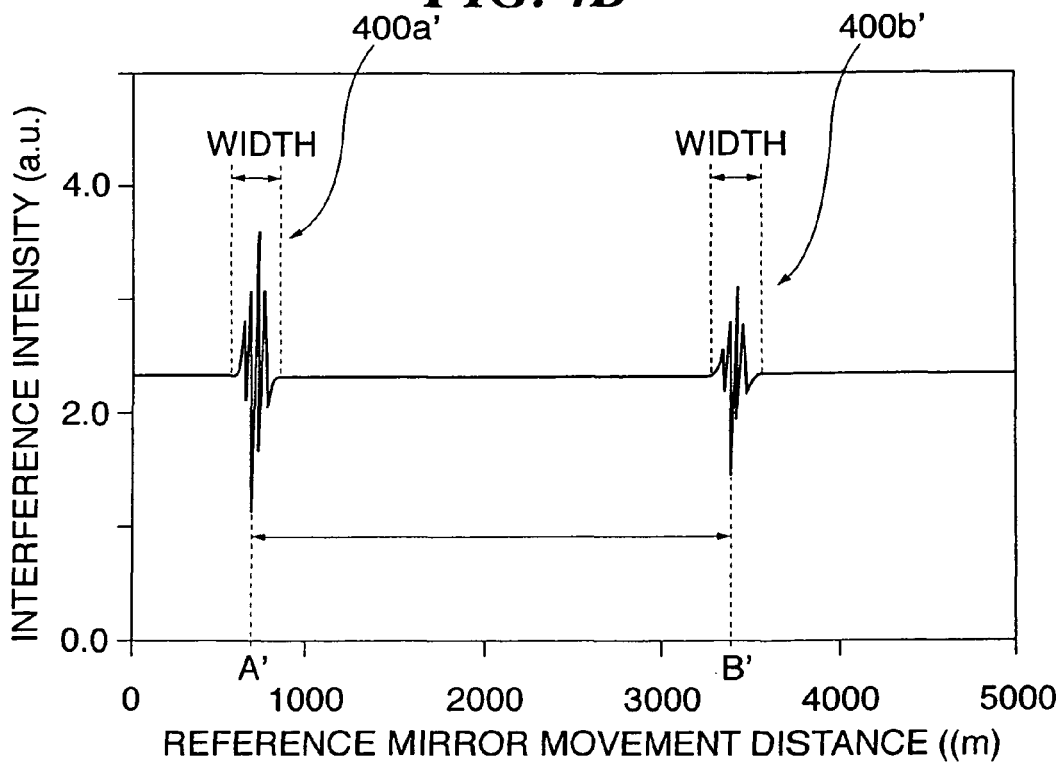

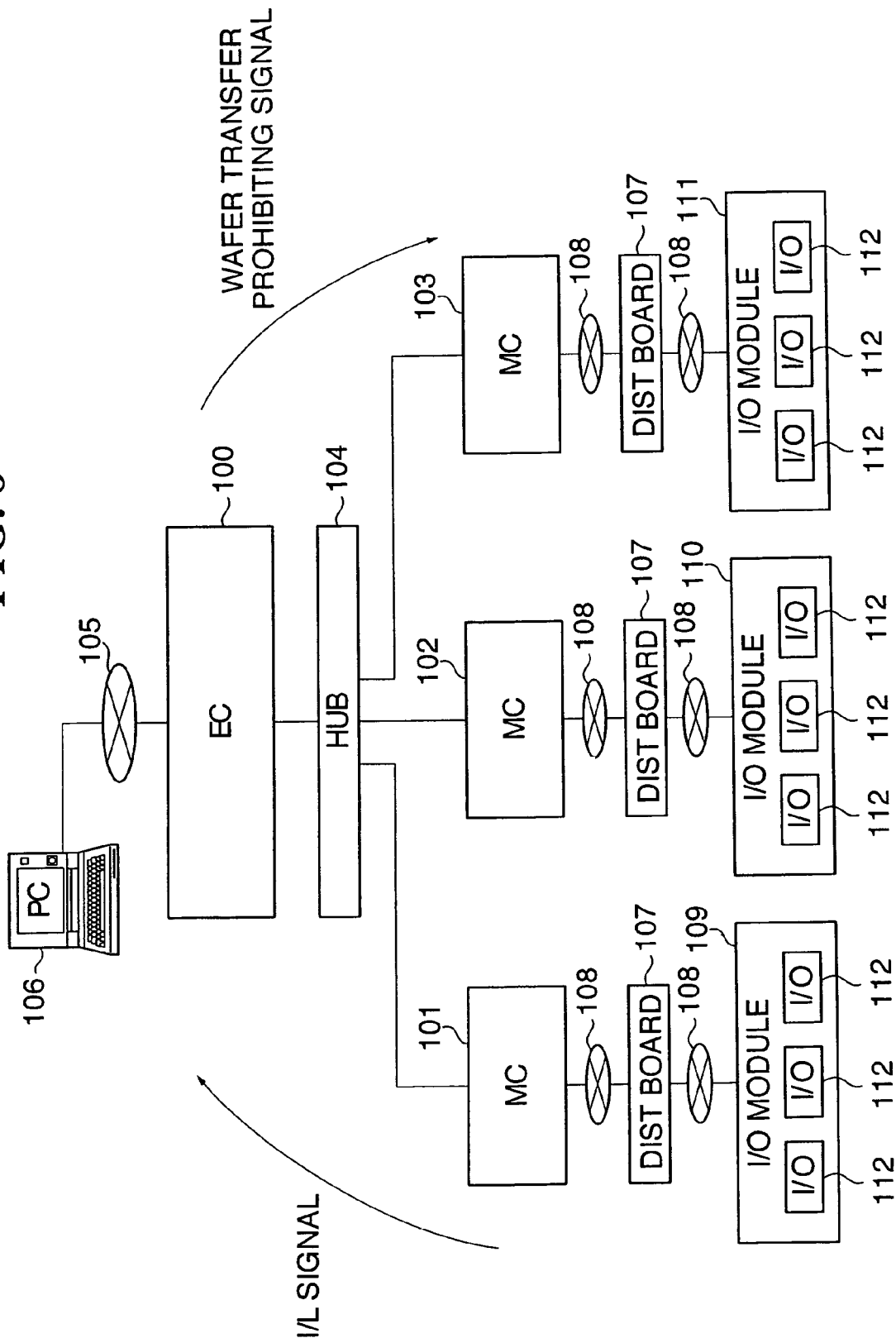

STAGE, SUBSTRATE PROCESSING APPARATUS, PLASMA PROCESSING APPARATUS, CONTROL METHOD FOR STAGE, CONTROL METHOD FOR PLASMA PROCESSING APPARATUS, AND STORAGE MEDIA

BACKGROUND OF THE INVENTION

1. Field of the Invention

The present invention relates to a stage, a substrate processing apparatus, a plasma processing apparatus, a control method for the stage, a control method for the plasma processing apparatus, and storage media, and in particular relates to a stage on which a substrate to be processed such as a semiconductor wafer is mounted, and a plasma processing apparatus having the stage therein.

2. Description of the Related Art

A plasma processing apparatus constituting a substrate processing apparatus carries out plasma processing such as etching using plasma on semiconductor wafers as substrates processed for manufacturing semiconductor devices.

Such a plasma processing apparatus has a processing chamber for carrying out the plasma processing, an upper electrode and a lower electrode being provided in the chamber for supplying predetermined RF (radio frequency) power for producing the plasma. The lower electrode also acts as a stage (susceptor) on which each semiconductor wafer is mounted. The stage has an ESC (electrostatic chuck) function of electrostatically attracting (chucking) thereto the semiconductor wafer mounted thereon through application of a predetermined voltage.

Moreover, in such a plasma processing apparatus, before carrying out the plasma processing on a semiconductor wafer, reaction by-products or the like attached to an inner wall of the chamber may be removed by carrying out waferless dry cleaning (WLDC) (see U.S. Pat. No. 6,325,948, for example).

However, for such a plasma processing apparatus, each time the plasma processing or the WLDC is carried out, and furthermore each time a semiconductor wafer is attracted onto the stage, the surface state of the stage changes.

Specifically, reaction by-products comprised of fine particles produced through the plasma processing become attached as deposit to low-temperature portions of the surface of the stage in particular. Moreover, the surface of the stage is roughened (worn away) through the WLDC. Furthermore, when a semiconductor wafer is attracted onto the stage, slight movement occurs while a rear surface of the semiconductor wafer is in contact with the surface of the stage, and hence minute undulations on the surface of the stage are smoothed down.

As a result of the above, the actual area over which the surface of the stage and the rear surface of the semiconductor wafer contact one another changes, and hence the thermal transmission characteristics between the stage and the semiconductor wafer change (i.e. ESC drift occurs). This ESC drift is also affected by the time period (or number of times) of usage of the plasma processing apparatus, for example by the time period for which the RF power has been supplied.

In recent years, as semiconductor devices have become smaller in size, very high processing precision has come to be demanded of plasma processing such as etching. To achieve such high processing precision, it is necessary to make each of the semiconductor wafers subjected to the plasma processing be at the same temperature. However, ESC drift causes the thermal transmission characteristics between the stage and a semiconductor wafer to change as described above, and hence directly affects the temperature of each semiconductor wafer. In a plasma processing apparatus, there is thus a problem that even if the plasma processing such as etching is carried out under the same conditions, for example at the same RF power, for each of the semiconductor wafers, the temperature differs between the semiconductor wafers, and hence the processing precision changes, whereby the semiconductor device yield decreases.

SUMMARY OF THE INVENTION

It is an object of the present invention to provide a stage, a substrate processing apparatus, a plasma processing apparatus, a control method for the stage, a control method for the plasma processing apparatus, and storage media, that enable the semiconductor device yield to be improved.

To attain the above object, in a first aspect of the present invention, there is provided a stage onto which is electrostatically attracted a substrate to be processed in a substrate processing apparatus, the stage comprising: a temperature measuring unit that measures a temperature of the substrate to be processed; a temperature adjusting unit that carries out temperature adjustment on the substrate to be processed such as to become equal to a target temperature based on a preset parameter; and a substrate temperature controlling unit that controls the temperature of the substrate to be processed by controlling the temperature adjustment by the temperature adjusting unit based on a measured temperature measured by the temperature measuring unit.

According to the above stage, the temperature adjustment of the substrate to be processed is controlled based on the measured temperature. As a result, the semiconductor device yield can be improved.

Preferably, the target temperature comprises a temperature profile showing temperature changes over a predetermined time period.

According to the above stage, the target temperature comprises a temperature profile showing temperature changes over a predetermined time period. The temperature of the substrate to be processed tends to change with time. Rather than setting the target temperature to a value that does not change with the passage of time, and adjusting the temperature of the substrate to be processed to match this value, it is thus easier to set the target temperature to a value that changes with the passage of time, and adjust the temperature of the substrate to be processed so as to match this changing value. As a result, the temperature of the substrate to be processed can easily be matched to the target temperature.

Preferably, the substrate temperature controlling unit adjusts the parameter when the measured temperature is different to the target temperature.

According to the above stage, the parameter is adjusted if the measured temperature is different to the target temperature. As a result, the temperature of the substrate to be processed can be stabilized to the target temperature.

Preferably, there is further provided with an alarm output unit that outputs a predetermined alarm when the measured temperature is different to the target temperature.

According to the above stage, a predetermined alarm is outputted if the measured temperature is different to the target temperature. As a result, a user can be notified that the measured temperature is different to the target temperature.

Preferably, the parameter comprises at least one selected from control parameters comprising a temperature and a flow rate of a coolant supplied into the stage, a voltage, a current, and an electrical power supplied to the stage, and a temperature, a flow rate, a pressure, and a type of a heat-transmitting gas supplied onto a rear surface of the substrate to be processed.

According to the above stage, the parameter comprises at least one selected from control parameters comprising a temperature and a flow rate of a coolant supplied into the stage, a voltage, a current, and an electrical power supplied to the stage, and a temperature, a flow rate, a pressure, and a type of a heat-transmitting gas supplied onto a rear surface of the substrate to be processed. As a result, the temperature of the substrate to be processed can be adjusted indirectly by controlling the temperature of the stage, or else the temperature of the substrate to be processed can be controlled directly.

Preferably, the substrate temperature controlling unit separately controls a temperature of each of a central portion and a peripheral portion of the substrate to be processed.

According to the above stage, the substrate temperature controlling means separately controls a temperature of each of a central portion and a peripheral portion of the substrate to be processed. As a result, the temperature of each of the central portion and the peripheral portion of the substrate to be processed can be set to a temperature optimum for semiconductor device manufacture, and hence the semiconductor device yield can be further improved.

To attain the above object, in a second aspect of the present invention, there is provided a substrate processing apparatus having a stage as described above.

To attain the above object, in a third aspect of the present invention, there is provided a plasma processing apparatus having a stage onto which is electrostatically attracted a substrate to be processed that is to be subjected to first plasma processing, the plasma processing apparatus comprising: a varying temperature processing unit that carries out varying temperature processing involving changing a temperature of the substrate to be processed; a temperature measuring unit that measures the temperature of the substrate to be processed; storage unit that stores in advance a first profile relating to the temperature of the substrate to be processed measured when carrying out the varying temperature processing on the substrate to be processed after the first plasma processing has been carried out a first predetermined number of times or for a first predetermined time period; a comparing unit that comparing the first profile with a second profile relating to the temperature of the substrate to be processed measured when carrying out the varying temperature processing on the substrate to be processed after the first plasma processing has been carried out a second predetermined number of times or for a second predetermined time period; and a stage recovery unit that carries out second plasma processing on the stage in accordance with results of the comparison.

According to the above plasma processing apparatus, a second profile relating to the temperature of the substrate to be processed measured when carrying out the varying temperature processing on the substrate to be processed after the first plasma processing has been carried out a second predetermined number of times or for a second predetermined time period is compared with a first profile that was stored in advance after the first plasma processing had been carried out a first predetermined number of times or for a first predetermined time period, and second plasma processing is carried out on the stage in accordance with results of the comparison. As a result, the surface state of the stage can be stabilized, and hence the semiconductor device yield can be improved.

Preferably, the stage recovery unit carries out the second plasma processing on the stage when a difference between the first profile and the second profile not is within a permissible range.

According to the above plasma processing apparatus, the second plasma processing is carried out on the stage if a difference between the first profile and the second profile is not within a permissible range. As a result, the surface state of the stage can be stabilized appropriately.

Preferably, the stage recovery unit carries out processing of roughening a surface of the stage onto which the substrate to be processed is attracted as the second plasma processing when the second profile is lower than the first profile.

According to the above plasma processing apparatus, if the second profile is lower than the first profile, then processing of roughening a surface of the stage onto which the substrate to be processed is attracted is carried out as the second plasma processing. As a result, thermal transmission between the substrate to be processed and the stage can be reduced, whereby the temperature can be made to be the same for each of the substrates to be processed subjected to the first plasma processing.

Preferably, the stage recovery unit carries out processing of smoothing a surface of the stage onto which the substrate to be processed is attracted as the second plasma processing when the second profile is higher than the first profile.

According to the above plasma processing apparatus, if the second profile is higher than the first profile, then processing of smoothing a surface of the stage onto which the substrate to be processed is attracted is carried out as the second plasma processing. As a result, thermal transmission between the substrate to be processed and the stage can be increased, whereby the temperature can be made to be the same for each of the substrates to be processed subjected to the first plasma processing.

Preferably, there is further provided with an alarm output unit that outputs a predetermined alarm in response to a difference between the first profile and the second profile not being within a permissible range.

According to the above plasma processing apparatus, if a difference between the first profile and the second profile is not within a permissible range, then a predetermined alarm is outputted. As a result, a user can be notified that the difference between the first profile and the second profile is not within the permissible range.

To attain the above object, in a fourth aspect of the present invention, there is provided a control method for a stage onto which is electrostatically attracted a substrate to be processed in a substrate processing apparatus, the control method comprising: a temperature measuring step of measuring a temperature of the substrate to be processed; a temperature adjusting step of carrying out temperature adjustment on the substrate to be processed such as to become equal to a target temperature based on a preset parameter; and a substrate temperature controlling step of controlling the temperature of the substrate to be processed by controlling the temperature adjustment in the temperature adjusting step based on a measured temperature measured in the temperature measuring step.

To attain the above object, in a fifth aspect of the present invention, there is provided a control method for a plasma processing apparatus having a stage onto which is electrostatically attracted a substrate to be processed that is to be subjected to first plasma processing, the control method comprising: a varying temperature processing step of carrying out varying temperature processing involving changing a temperature of the substrate to be processed; a temperature measuring step of measuring the temperature of the substrate to be processed; a storage step of storing in advance a first profile relating to the temperature of the substrate to be processed measured when carrying out the varying temperature processing on the substrate to be processed after the first plasma processing has been carried out a first predetermined number of times or for a first predetermined time period; a comparing step of comparing the first profile with a second profile relating to the temperature of the substrate to be processed measured when carrying out the varying temperature processing on the substrate to be processed after the first plasma processing has been carried out a second predetermined number of times or for a second predetermined time period; and a stage recovery step of carrying out second plasma processing on the stage in accordance with results of the comparison.

To attain the above object, in a sixth aspect of the present invention, there is provided a computer-readable storage medium storing a control program for causing a computer to implement a control method for a stage onto which is electrostatically attracted a substrate to be processed in a substrate processing apparatus, the control program comprising: a temperature measuring module for measuring a temperature of the substrate to be processed; a temperature adjusting module for carrying out temperature adjustment on the substrate to be processed such as to become equal to a target temperature based on a preset parameter; and a substrate temperature controlling module for controlling the temperature of the substrate to be processed by controlling the temperature adjustment by the temperature adjusting module based on a measured temperature measured by the temperature measuring module.

To attain the above object, in a seventh aspect of the present invention, there is provided a computer-readable storage medium storing a control program for causing a computer to implement a control method for a plasma processing apparatus having a stage onto which is electrostatically attracted a substrate to be processed that is to be subjected to first plasma processing, the control program comprising: a varying temperature processing module for carrying out varying temperature processing involving changing a temperature of the substrate to be processed; a temperature measuring module for measuring the temperature of the substrate to be processed; a storage module for storing in advance a first profile relating to the temperature of the substrate to be processed measured when carrying out the varying temperature processing on the substrate to be processed after the first plasma processing has been carried out a first predetermined number of times or for a first predetermined time period; a comparing module for comparing the first profile with a second profile relating to the temperature of the substrate to be processed measured when carrying out the varying temperature processing on the substrate to be processed after the first plasma processing has been carried out a second predetermined number of times or for a second predetermined time period; and a stage recovery module for carrying out second plasma processing on the stage in accordance with results of the comparison.

The above and other objects, features, and advantages of the invention will become more apparent from the following detailed description taken in conjunction with the accompanying drawings.

BRIEF DESCRIPTION OF THE DRAWINGS

FIGS. 4A and 4B are graphs showing examples of interference waveforms between reflected light from a wafer and reflected reference light detected by a PD appearing in FIG. 3, in which FIG. 4A shows an interference waveform obtained before changing a temperature of the wafer, and FIG. 4B shows an interference waveform obtained after changing the temperature of the wafer.

FIGS. 5A and 5B are graphs showing reference data for a peripheral portion of a wafer stored in a control unit appearing in FIG. 2, in which FIG. 5A is a graph showing reference data for when the pressure of a backside gas on a central portion of the wafer is held constant, and FIG. 5B is a graph showing reference data for when the pressure of the backside gas on the peripheral portion of the wafer is held constant.

FIG. 8 is a diagram schematically showing the construction of a system controller for the substrate processing apparatus shown in FIG. 1.

DESCRIPTION OF THE PREFERRED EMBODIMENTS

The present invention will now be described in detail with reference to the drawings showing preferred embodiments thereof.

Figure 1:
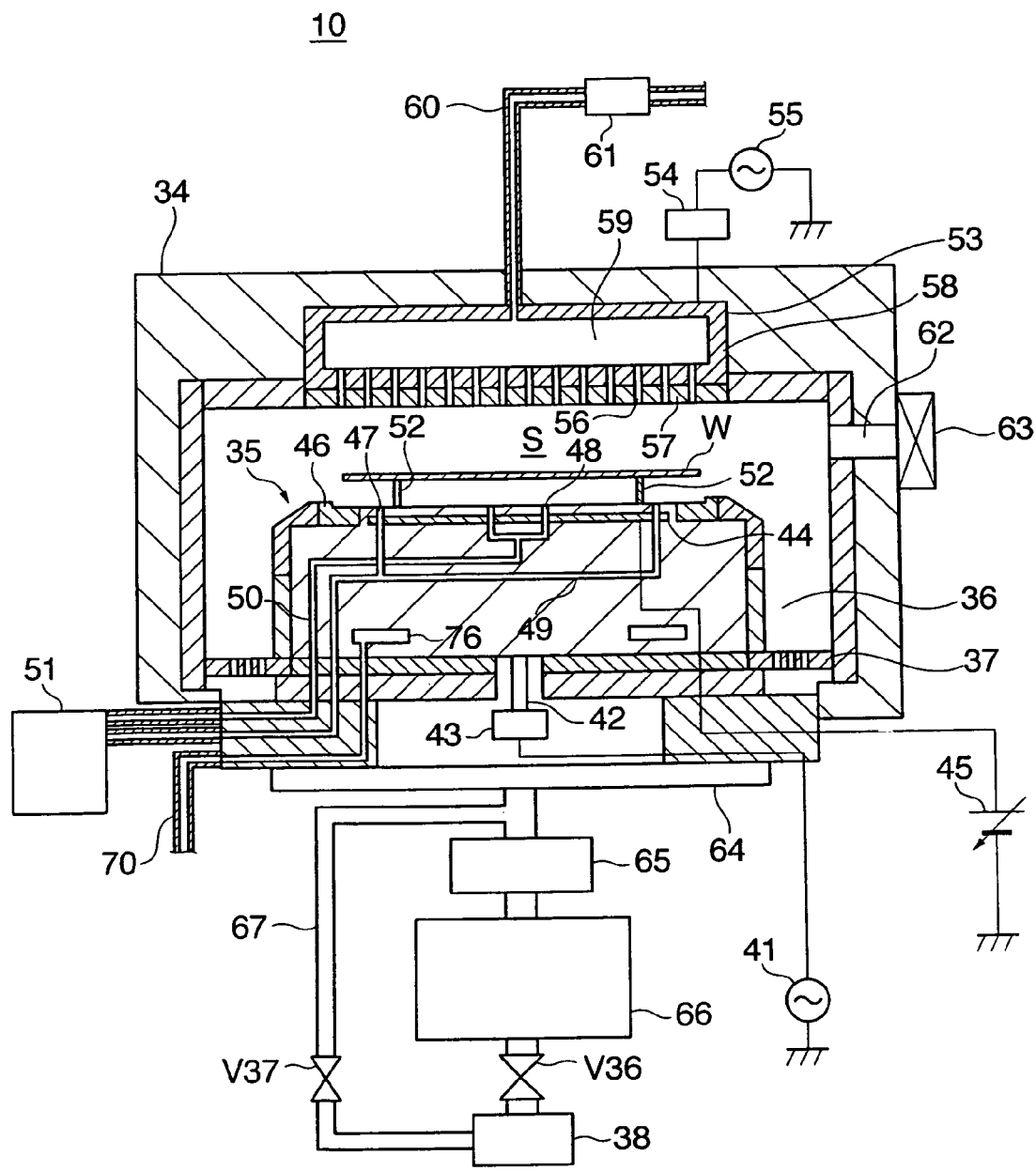
FIG. 1 is a sectional view schematically showing the construction of a substrate processing apparatus having therein a stage according to an embodiment of the present invention.

FIG. 1 is a sectional view schematically showing the construction of a substrate processing apparatus having therein a stage according to an embodiment of the present invention. The plasma processing apparatus constituting the substrate processing apparatus is constructed such as to carry out plasma processing such as RIE (reactive ion etching) or ashing on semiconductor wafers W (hereinafter referred to merely as "wafers W") as substrates to be processed.

As shown in FIG. 1, the plasma processing apparatus 10 has a cylindrical chamber 34 made of aluminum having an inner wall thereof coated with alumite. A cylindrical stage 35 is disposed in the chamber 34 as a stage on which is mounted a wafer W having a diameter of 300 mm, for example.

In the plasma processing apparatus 10, an exhaust path 36 that acts as a flow path through which gas molecules above the stage 35 are discharged to the outside of the chamber 34 is formed between an inner side wall of the chamber 34 and a side face of the stage 35. An annular baffle plate 37 that prevents leakage of plasma is disposed part way along the exhaust path 36. A space in the exhaust path 36 downstream of the baffle plate 37 bends round below the stage 35, and is communicated with an automatic pressure control valve (hereinafter referred to as the "APC valve") 64, which is a variable butterfly valve. The APC valve 64 is connected to a turbo-molecular pump (hereinafter referred to as the "TMP") 66, which is an exhausting pump for evacuation, via and an isolator 65, and the TMP 66 is connected to a dry pump (hereinafter referred to as the "DP") 38, which is also an exhausting pump, via a valve V36. The exhaust flow path (main exhaust line) comprised of the APC valve 64, the isolator 65, the TMP 66, the valve V36 and the DP 38 is used for controlling the pressure in the chamber 34 using the APC valve 64, and also for reducing the pressure in the chamber 34 down to a substantially vacuum state using the TMP 66 and the DP 38.

Moreover, piping 67 is connected from between the APC valve 64 and the isolator 65 to the DP 38 via a valve V37. The exhaust flow path (bypass line) comprised of the piping 67 and the valve V37 bypasses the TMP 66, and is used for roughing the chamber 34 using the DP 38.

A lower electrode radio frequency power source 41 is connected to the stage 35 via a feeder rod 42 and a matcher 43. The lower electrode radio frequency power source 41 supplies predetermined radio frequency electrical power (HV RF power) to the stage 35. The stage 35 thus acts as a lower electrode. The matcher 43 reduces reflection of the radio frequency electrical power from the stage 35 so as to maximize the efficiency of the supply of the radio frequency electrical power into the stage 35.

A disk-shaped ESC electrode plate 44 comprised of an electrically conductive film is provided in an upper portion of the stage 35. A DC power source 45 is electrically connected to the ESC electrode plate 44. A wafer W is attracted to and held on an upper surface of the stage 35 through a Johnsen-Rahbek force or a Coulomb force generated by a DC ESC voltage (DC voltage) applied to the ESC electrode plate 44 from the DC power source 45. Moreover, an annular focus ring 46 is provided on the stage 35 so as to surround the wafer W attracted to and held on the upper surface of the stage 35. The focus ring 46 is exposed to a space S, described below, and focuses the plasma in the space S toward a front surface of the wafer W, thus improving the efficiency of the plasma processing. Further the focus ring 46 enlarges a plasma distributing region upto the focus ring 46 itself, thus preventing the peripheral portion of the wafer F from being subjected to the abnormal processing (for example, the plasma processing is more in ununiformity at the edge portion of the wafer W than at the center portion of the wafer W.

An annular coolant chamber 76 that extends, for example, in a circumferential direction of the stage 35 is provided inside the stage 35. A coolant, for example cooling water or a Galden (registered trademark) fluid, at a predetermined temperature is circulated through the coolant chamber 76 via coolant piping 70 from a chiller unit (not shown). A temperature of the stage 35, and hence a processing temperature of the wafer W attracted to and held on the upper surface of the stage 35, is controlled through the temperature of the coolant.

A plurality of peripheral heat-transmitting gas supply holes 47 facing a peripheral portion of the wafer W and a plurality of central heat-transmitting gas supply holes 48 facing a central portion of the wafer W are provided in a portion of the upper surface of the stage 35 on which the wafer W is attracted and held (hereinafter referred to as the "attracting surface").

The peripheral heat-transmitting gas supply holes 47 and the central heat-transmitting gas supply holes 48 are connected to a heat-transmitting gas supply unit 51 respectively by two heat-transmitting gas supply lines 49 and 50 provided inside the stage 35. The heat-transmitting gas supply unit 51 supplies helium gas as a heat-transmitting gas (backside gas) via the peripheral heat-transmitting gas supply holes 47 and the central heat-transmitting gas supply holes 48 into a gap between the attracting surface of the stage 35 and a rear surface of the wafer W. The peripheral heat-transmitting gas supply holes 47 and the central heat-transmitting gas supply holes 48, the two heat-transmitting gas supply lines 49 and 50, and the heat-transmitting gas supply unit 51 together constitute a heat-transmitting gas supply apparatus. Note that the type of the backside gas is not limited to being helium (He), but rather may also be an inert gas such as nitrogen ($N_2$), argon (Ar), krypton (Kr) or xenon (Xe), or oxygen ($O_2$) or the like instead. The heat-transmitting gas supply apparatus separately controls the temperature of each of the peripheral portion and the central portion of the wafer W by controlling the temperature, flow rate, pressure, type and so on of the backside gas supplied from each of the peripheral heat-transmitting gas supply holes 47 and the central heat-transmitting gas supply holes 48. As a result, the temperature of each of the central portion and the peripheral portion of the wafer W can be set to a temperature optimum for semiconductor device manufacture.

A plurality of, for example three, pusher pins 52 are provided in the attracting surface of the stage 35 as lifting pins that can be made to project out from the upper surface of the stage 35. The pusher pins 52 are connected to a motor (not shown) by a ball screw (not shown), and can be made to project out from the attracting surface of the stage 35 through rotational motion of the motor, which is converted into linear motion by the ball screw. The pusher pins 52 are housed inside the stage 35 when a wafer W is being attracted to and held on the attracting surface of the stage 35 so that the wafer W can be subjected to the plasma processing, and are made to project out from the upper surface of the stage 35 so as to lift the wafer W up away from the stage 35 when the wafer W is to be transferred out from the chamber 34 after having been subjected to the plasma processing.

A gas introducing shower head 53 is disposed in a ceiling portion of the chamber 34 facing the stage 35. An upper electrode radio frequency power source 55 is connected to the gas introducing shower head 53 via a matcher 54. The upper electrode radio frequency power source 55 supplies predetermined radio frequency electrical power to the gas introducing shower head 53. The gas introducing shower head 53 thus acts as an upper electrode. The matcher 54 has a similar function to the matcher 43, described earlier.

The gas introducing shower head 53 has a ceiling electrode plate 57 having a large number of gas holes 56 therein, and an electrode support 58 on which the ceiling electrode plate 57 is detachably supported. A buffer chamber 59 is provided inside the electrode support 58. A processing gas introducing pipe 60 is connected from a processing gas supply unit (not shown) to the buffer chamber 59. A piping insulator 61 is disposed part way along the processing gas introducing pipe 60. The piping insulator 61 is made of an electrically insulating material, and prevents the radio frequency electrical power supplied to the gas introducing shower head 53 from leaking into the processing gas supply unit via the processing gas introducing pipe 60. A processing gas supplied from the processing gas introducing pipe 60 into the buffer chamber 59 is supplied by the gas introducing shower head 53 into the chamber 34 via the gas holes 56.

A transfer port 62 for the wafers W is provided in a side wall of the chamber 34 in a position at the height of a wafer W that has been lifted up from the stage 35 by the pusher pins 52. A gate valve 63 for opening and closing the transfer port 62 is provided in the transfer port 62.

Upon supplying radio frequency electrical power to the stage 35 and the gas introducing shower head 53 in the chamber 34 of the plasma processing apparatus 10 as described above, and thus applying radio frequency electrical power into the space S between the stage 35 and the gas introducing shower head 53, high-density plasma is produced from the processing gas supplied from the gas introducing shower head 53 into the space S. The wafer W is subjected to the plasma processing by the plasma.

Specifically, when subjecting a wafer W to the plasma processing in the plasma processing apparatus 10, first, the gate valve 63 is opened, and the wafer W to be processed is transferred into the chamber 34, and attracted to and held on the attracting surface of the stage 35 by applying an ESC voltage to the ESC electrode plate 44. Moreover, the processing gas (e.g. a mixed gas comprised of $CF_4$ gas, $O_2$ gas, and Ar gas with a predetermined flow ratio therebetween) is supplied from the gas introducing shower head 53 into the chamber 34, and the pressure inside the chamber 34 is controlled to a predetermined value using the APC valve 64. Furthermore, radio frequency electrical power is applied into the space S in the chamber 34 from the stage 35 and the gas introducing shower head 53. The processing gas introduced in from the gas introducing shower head 53 is thus turned into plasma in the space S. The plasma is focused onto the front surface of the wafer W by the focus ring 46, whereby the front surface of the wafer W is physically/chemically etched.

Operation of the component elements of the plasma processing apparatus 10 described above is controlled in accordance with a program for the plasma processing by a system controller shown in FIG. 8, described below. Alternatively, the control may be carried out by a CPU 410 of a control unit 400 (see FIG. 2) connected to the plasma processing apparatus 10 instead of the system controller.

Figure 2:
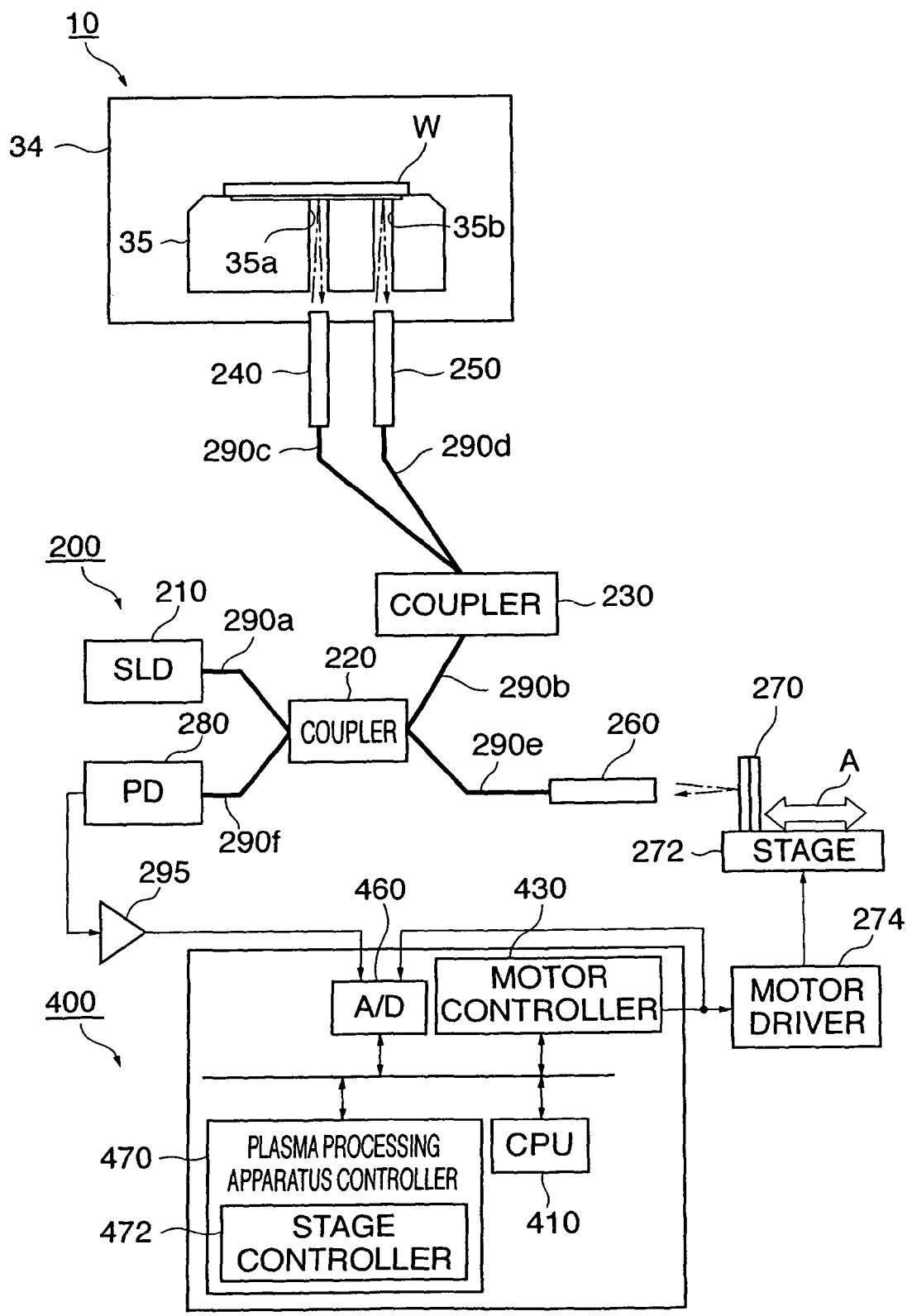
FIG. 2 is a block diagram schematically showing the construction of a temperature control system including the substrate processing apparatus shown in FIG. 1.

A central opening 35a and a peripheral opening 35b are formed in the stage 35 in the chamber 34 as shown in FIG. 2, described below, for measuring the temperature of respectively the central portion and the peripheral portion of the wafer W.

FIG. 2 is a block diagram schematically showing the construction of a temperature control system including the plasma processing apparatus 10 shown in FIG. 1.

As shown in FIG. 2, the temperature control system is comprised of the plasma processing apparatus 10 shown in FIG. 1, a temperature measuring apparatus 200 that is connected to the plasma processing apparatus 10 and measures temperatures of a wafer W, and a temperature control unit 400 that adjusts the temperatures of the wafer W directly or indirectly such as to become substantially equal to target temperatures based on preset parameters.

The temperature measuring apparatus 200 is comprised of an SLD (superluminescent diode) 210 as a low-coherence light source having a short coherence length (where the term "coherence length" indicates the maximum optical path difference at which two divided beams can undergo interference), a 2×2 optical fiber coupler 220 that is connected to the SLD 210 and acts as a first splitter, a 1×2 optical fiber coupler 230 that is connected to the optical fiber coupler 220 and acts as a second splitter, collimating fibers 240 and 250 that are connected to the optical fiber coupler 230, a collimating fiber 260 that is connected to the optical fiber coupler 220, a photodetector (PD) 280 as a light receiving element that is connected to the optical fiber coupler 220, and optical fibers 290a, 290b, 290c, 290d, 290e, and 290f that connect the above elements together.

The SLD 210 is, for example, an SLD that emits light of center wavelength 1.55 μm or 1.31 μm and half width approximately 50 μm at a maximum power output of 1.5 mW. Each of the collimating fibers 240, 250, and 260 is comprised of a collimator for which its optical axis adjusting mechanism is connected to a holder so that the optical axis of the collimator is perpendicular to the surface of the object onto which the collimator emits light, and emits parallel light from the optical fiber 290c, 290d, or 290e respectively. The PD 280 is comprised of a Ge photodiode.

The temperature measuring apparatus 200 further has a reference mirror 270 disposed in front of the collimating fiber 260, a motor-driven stage 272 that is comprised of a stage on which the reference mirror 270 is mounted and a stepping motor that moves the stage horizontally, a motor driver 274 that drives the stepping motor of the motor-driven stage 272, and an amplifier 295 that is connected to the PD 280 and amplifies output signals from the PD 280. The reference mirror 270 is comprised of a corner cube prism or a plane mirror.

The collimating fibers 240 and 250 are disposed such as to respectively face a lower end of the central opening 35a and a lower end of the peripheral opening 35b of the stage 35, and each emits light from the SLD 210 as measuring light via the opening 35a or 35b toward the rear surface of the wafer W which is the object to be subjected to temperature measurement, and also receives reflected light from the wafer W and transmits this reflected light to the PD 280. The light-emitting surfaces of the collimating fibers 240 and 250 are preferably disposed such that the distance from the optical fiber coupler 230 to the rear surface of the wafer W, i.e. the optical path lengths, are different from each other, whereby the temperature measurements can be carried out simultaneously for the central portion and the peripheral portion of the wafer W.

The collimating fiber 260 emits light from the SLD 210 as reference light toward the reference mirror 270, and also receives reflected light from the reference mirror 270 and transmits this reflected light to the PD 280.

The motor-driven stage 272 moves the stage thereof horizontally in the direction of an arrow A shown in FIG. 2 such that a reflecting surface of the reference mirror 270 remains parallel with a light-emitting surface of the collimating fiber 260.

The control unit 400 is, for example, realized by a computer. The control unit 400 is comprised of a CPU (central processing unit) 410 that carries out overall control of the control unit 400, a motor controller 430 that controls, via the motor driver 274, the stepping motor of the motor-driven stage 272 that drives the stage on which the reference mirror 270 is mounted, an A/D converter 460 that subjects the output signals from the PD 280, which are inputted into the A/D converter 460 via the amplifier 295 of the temperature measuring apparatus 200, to analogue/digital conversion synchronized with control signals (e.g. driving pulses) outputted to the motor driver 274 from the motor controller 430, and a plasma processing apparatus controller 470 that controls portions of the plasma processing apparatus 10.

The plasma processing apparatus controller 470 includes a stage controller 472 that controls portions of the plasma processing apparatus 10 relating to the stage 35. The stage controller 472 controls the radio frequency electrical power (RF power) supplied from the radio frequency power source 41, the temperature, flow rate, and pressure of the backside gas supplied from the heat-transmitting gas supply unit 51, the temperature and flow rate of the coolant circulated through the coolant chamber 76, the ESC voltage applied to the ESC electrode plate 44 in the stage 35, and so on.

Figure 3:
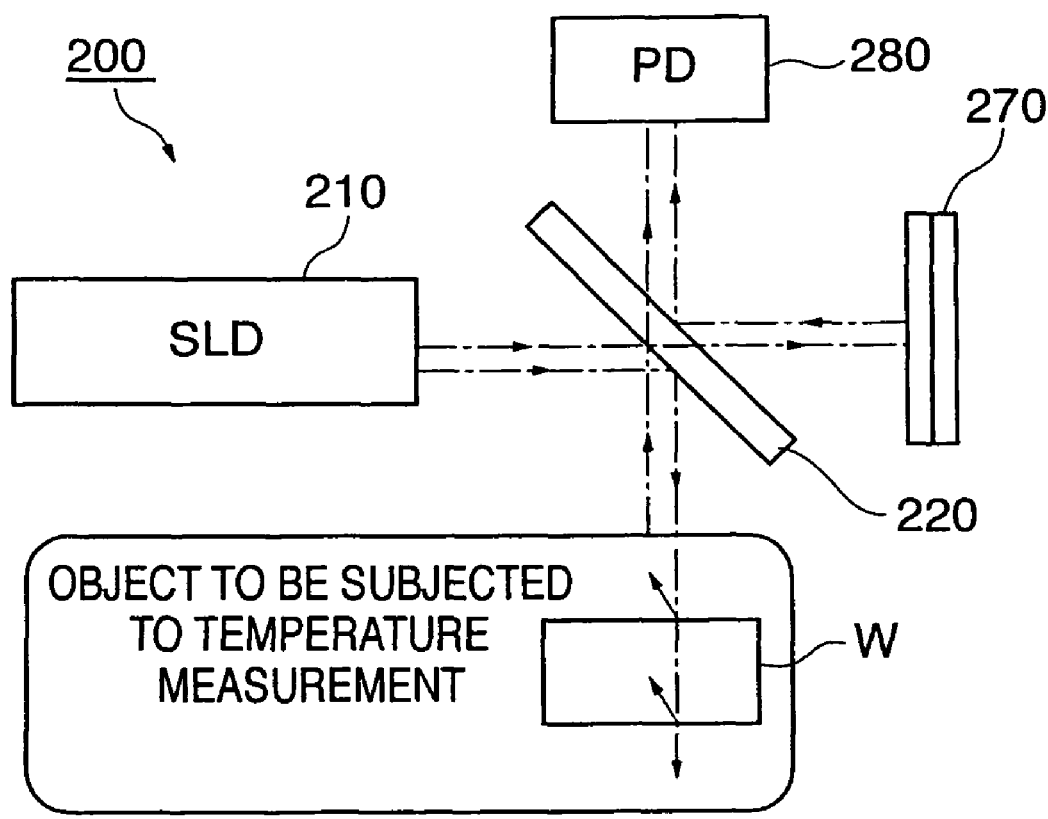
FIG. 3 is a drawing useful in explaining a temperature measuring operation of a temperature measuring apparatus appearing in FIG. 2.

FIG. 3 is a drawing useful in explaining a temperature measuring operation of the temperature measuring apparatus 200 appearing in FIG. 2.

The temperature measuring apparatus 200 uses a low coherence interferometer having a Michelson interferometer structure as its basic structure. As shown in FIG. 3, light from the SLD 210 is split into the measuring light and the reference light by the optical fiber coupler 220 which acts as a splitter, the measuring light being irradiated toward the wafer W which is the object to be subjected to the temperature measurement, and the reference light being irradiated toward the movable reference mirror 270. Reflected light obtained from the measuring light being reflected at the rear surface of the wafer W, reflected light obtained from the measuring light being reflected at the front surface of the wafer W, and reflected light obtained from the reference light being reflected at the reference mirror 270 reenter the optical fiber coupler 220. At this time, these types of reflected light undergo interference in accordance with the optical path length of the reference light, and the resulting interference light is detected by the PD 280.

The temperature measuring apparatus 200 of the plasma processing apparatus 10 is not limited to being one that uses a low coherence interferometer as described above, but rather may instead be comprised of, for example, a sensor that carries out the temperature measurement for a rear surface of the wafer, a sensor that carries out the temperature measurement by observing the surface of the wafer W from above.

FIGS. 4A and 4B are graphs showing examples of interference waveforms between the reflected light from the wafer W and the reflected reference light detected by the PD 280 appearing in FIG. 3, FIG. 4A showing an interference waveform obtained before changing a temperature of the wafer W, and FIG. 4B showing an interference waveform obtained after changing the temperature of the wafer W.

As shown in FIG. 4A, upon the reflected reference light from the reference mirror 270 and the reflected light from the rear surface of the wafer W undergoing interference with one another, for example an interference waveform 400$a$ is obtained over a width of approximately 80 μm, centered on an interference position A μm (interference intensity peak position: approximately 425 μm), as the movement distance of the reference mirror 270. Moreover, upon the reflected reference light from the reference mirror 270 and the reflected light from the front surface of the wafer W undergoing interference with one another, for example an interference waveform 400$b$ is obtained over a width of approximately 80 μm centered on an interference position B μm (interference intensity peak position: approximately 3285 μm).

Here, upon the temperature of the wafer W changing, the thickness of the wafer W changes through thermal expansion (or contraction), and accompanying this refractive index also changes. The optical path length through the wafer W being subjected to the measurement, i.e. the distance between the rear surface and the front surface of the wafer W, thus changes.

As shown in FIG. 4B, regarding an interference waveform 400$a'$ at an interference position A' and an interference waveform 400$b'$ at an interference position B' obtained for the rear surface and the front surface respectively of the wafer W at a different temperature to in FIG. 4A, the interference positions A' and B' indicating the interference intensity peak positions are shifted in a direction corresponding to an increase in the movement distance of the reference mirror 270 from the interference positions A and B, and moreover the width of the interference waveforms 400$a'$ and 400$b'$ is also changed compared with that of the interference waveforms 400$a$ and 400$b$.

The change in the interference intensity peak positions for the front surface and the rear surface of the wafer W can thus be related to the temperature change.

In the present embodiment, temperature conversion data showing the relationship between the interference intensity peak positions and each of a plurality of temperatures is thus stored in the control unit 400 as a database before the temperature of the wafer W is measured. Then, when the temperature of the wafer W is measured, first, the temperature measuring apparatus 200 inputs into the control unit 400, an output signal from the PD 280, i.e. a signal indicating the interference intensity peak positions as shown in FIG. 4A or 4B for each of the central portion and the peripheral portion of the wafer W. Next, the control unit 400 converts the inputted signal into a temperature for each of the central portion and the peripheral portion of the wafer W using the above temperature conversion data. As a result, the temperature of each of the central portion and the peripheral portion of the wafer W can be measured with no contact and with high precision.

Figure 6:
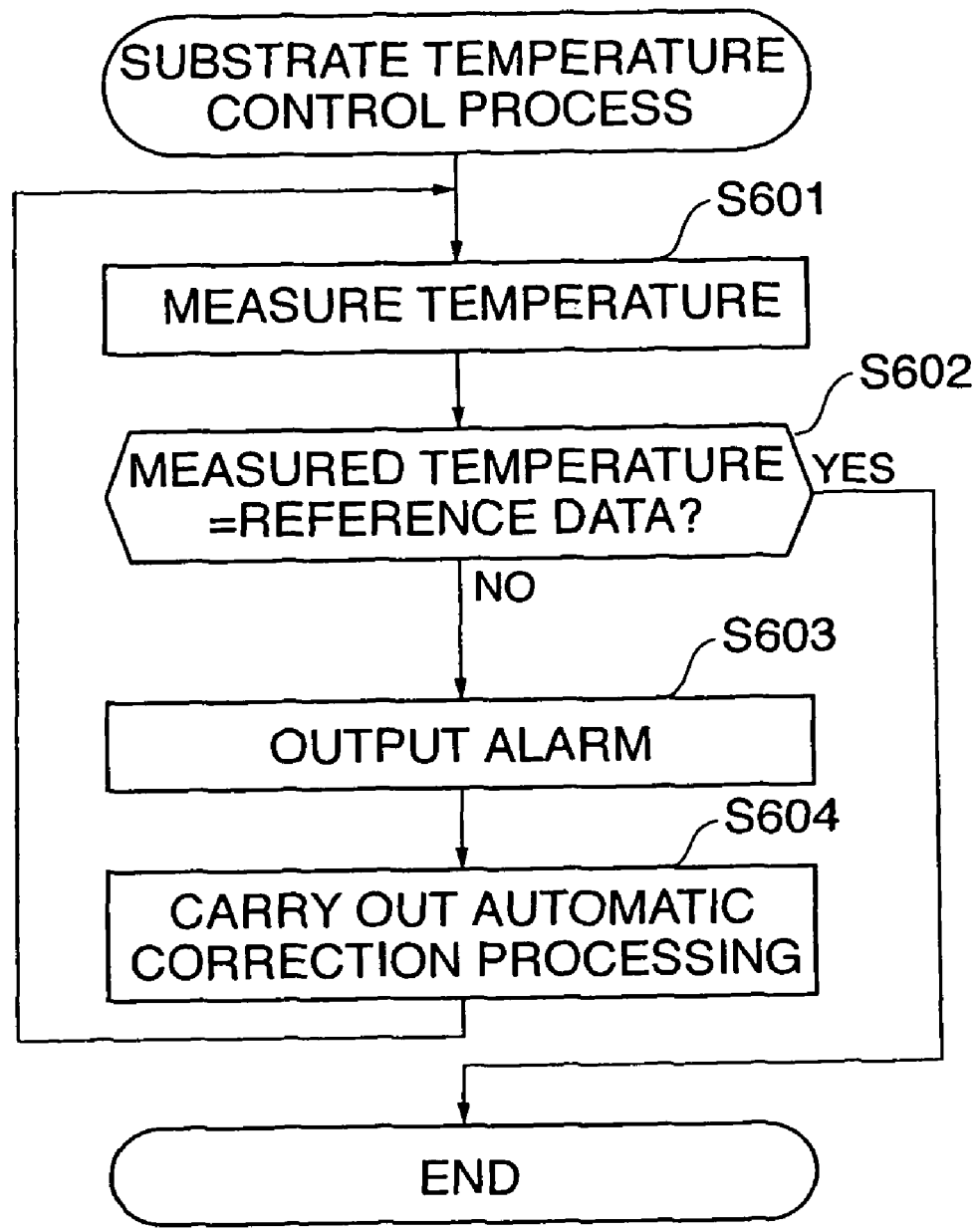
FIG. 6 is a flowchart of a first substrate temperature control process carried out by the control unit appearing in FIG. 2.
Figure 7:
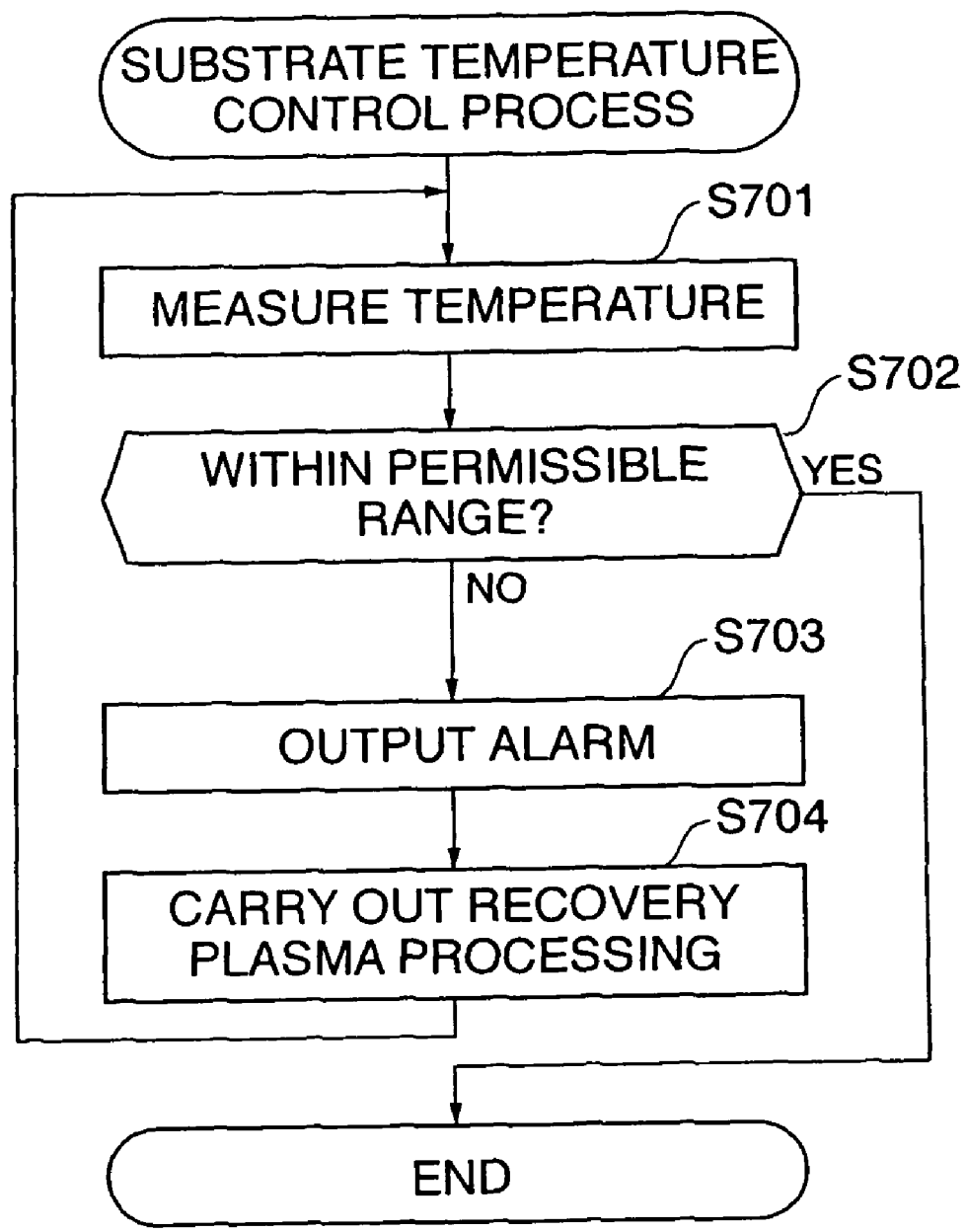
FIG. 7 is a flowchart of a second substrate temperature control process carried out by the control unit appearing in FIG. 2.

According to the temperature control system shown in FIG. 2, high precision is secured for the wafer W temperature measurement as described above. A first substrate temperature control process as shown in FIG. 6, described below, or a second substrate temperature control process as shown in FIG. 7, described below, is then carried out by the control unit 400.

Figure 5A:
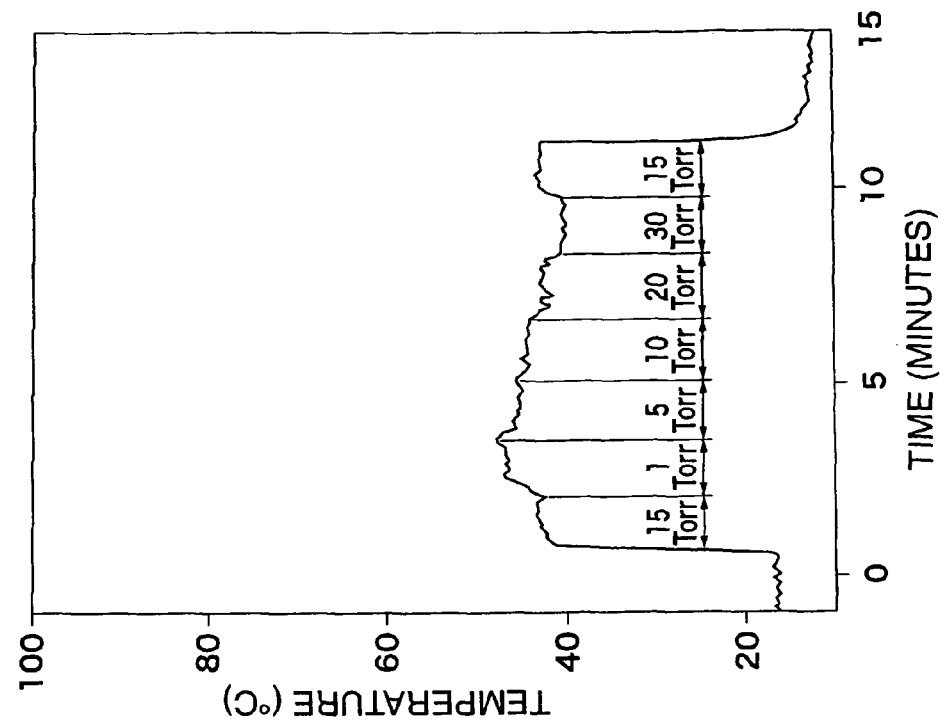
Figure 5B:
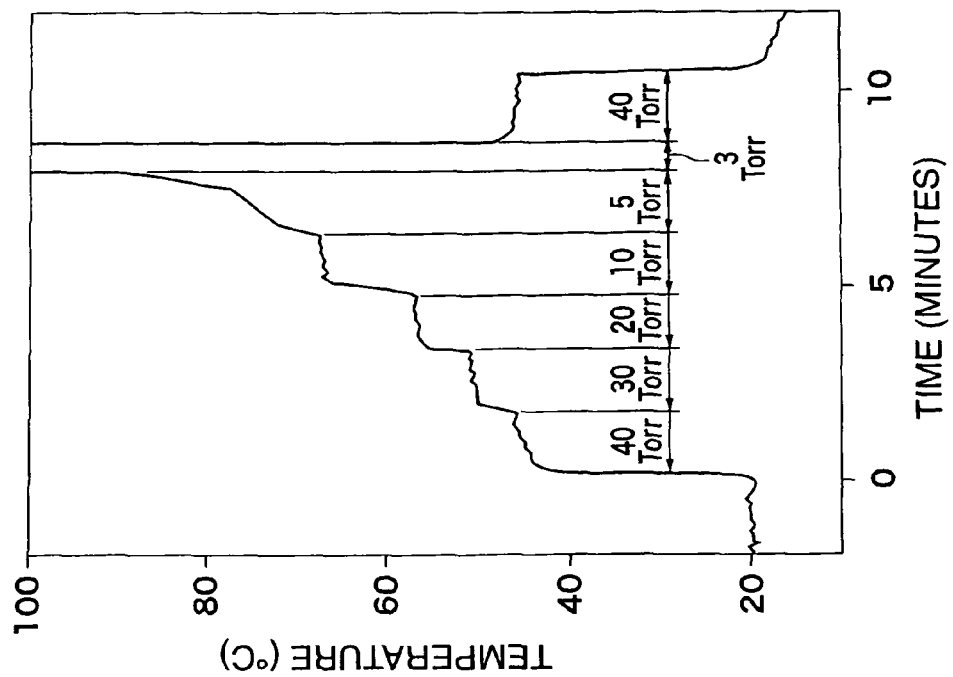

Moreover, reference data as shown in FIGS. 5A and 5B is also stored in the control unit 400.

The reference data of each of FIGS. 5A and 5B is comprised of a temperature profile showing data on temperature changes obtained when carrying out predetermined varying temperature processing on a wafer W over a predetermined time period after the plasma processing has been carried out in the plasma processing apparatus 10 a predetermined number of times or for a predetermined time period (e.g. 1 hour) as an initial value, i.e. showing temperature changes of the wafer W over a predetermined time period. The time 0 in each of FIGS. 5A and 5B indicates the time when supply of the RF power was commenced.

The reference data of FIG. 5A is, specifically, comprised of a temperature profile showing temperature changes of the peripheral portion of the wafer W obtained when, regarding the pressure of helium as a backside gas (cooling gas), the pressure on the peripheral portion of the wafer W was changed to 40, 30, 20, 10, 5, 3, and 40 torr in seven stages at approximately 1.5 minute intervals, with the pressure on the central portion of the wafer W held constant at 15 torr (2.00 kPa).

The reference data of FIG. 5B is, specifically, comprised of a temperature profile showing temperature changes of the peripheral portion of the wafer W obtained when, regarding the pressure of helium as a backside gas (cooling gas), the pressure on the central portion of the wafer was changed W to 15, 1, 5, 10, 20, 30, and 15 torr in seven stages at approximately 1.5 minute intervals, with the pressure on the peripheral portion of the wafer W held constant at 40 torr (5.33 kPa).

These temperature profiles are stored as wafer W target temperatures.

The data in FIG. 5B shows that even if the pressure of the cooling gas on the peripheral portion of the wafer W is fixed, the temperature of the peripheral portion is affected by the pressure of the cooling gas on the central portion. It can thus be seen that the pressure of the helium cooling gas while the RF power is being supplied to the stage 35 has a large effect on the temperature of the wafer W. That is, the reference data of FIG. 5B shows, for example, that to hold the temperature of the peripheral portion of the wafer W at approximately 45° C., if the pressure on the peripheral portion of the wafer W is 40 torr, then the pressure on the central portion of the wafer W should be set to 15 torr. Moreover, from the reference data of FIGS. 5A and 5B, a backside gas pressure range over which the temperature of the wafer W does not change (i.e. an upper limit and a lower limit of a permissible range) can be determined.

By storing reference data such as that shown in FIGS. 5A and 5B each time the plasma processing apparatus 10 is used, and reading out the reference data in time series order, the size of effects such as ESC drift arising in the stage 35 can be determined.

Note that the reference data described above is not limited to being stepped data as shown in FIGS. 5A and 5B, but rather may be any data obtained by carrying out varying temperature processing involving changing the temperature of a wafer W.

Moreover, for the temperature control system shown in FIG. 2 described above, the wafer W temperatures are measured directly with no contact by irradiating light onto the rear surface of the wafer W, but any method enabling the wafer W temperatures to be measured may be used.

Furthermore, the control unit 400 may measure the movement position or movement distance of the reference mirror 270 based on control signals outputted to the motor controller 430. In this case, the stage of the motor-driven stage 272 is preferably provided with a linear encoder.

FIG. 6 is a flowchart of a first substrate temperature control process carried out by the control unit 400 appearing in FIG. 2. Each time reference data as shown in FIGS. 5A and 5B described above has been stored as target temperatures, and furthermore the plasma processing described above has been repeated in the plasma processing apparatus 10 another predetermined number of times or for another predetermined time period (e.g. 20 hours), the present process is carried out with a wafer W attracted to and held on the stage 35 before commencement of or after processing on a lot of the wafers W or during an idle period. Moreover, at this time, the coolant temperature is set to 0° C., for example. The wafer W is preferably a non-product processing substrate (a dummy substrate).

As shown in FIG. 6, first, in step S601, the wafer W is subjected to the varying temperature processing described above. At this time, the control unit 400 converts signals inputted from the amplifier 295 into temperatures, so as to measure the temperatures of the central portion and the peripheral portion of the wafer W in contact with the stage 35. As a result, a measured temperature profile for each of the central portion and the peripheral portion for when carrying out the varying temperature processing on the wafer W is obtained. The varying temperature processing is realized by varying control parameters related to the wafer W temperature such as the temperature and flow rate of the coolant supplied into the stage 35 from the chiller unit, the voltage, current, and electrical power applied to the stage 35, and the temperature, flow rate, pressure, and type of the backside gas supplied onto the rear surface of the wafer W.

Next, in step S602, it is determined whether or not the measured temperature profile for the wafer W is substantially equal to the stored wafer W target temperatures (the reference data), i.e. whether or not the stage 35 is adequately thermally transmitting the temperature of the coolant to the wafer W. If the result of the determination is that the measured temperature profile for the wafer W obtained in step S601 and the reference data are substantially equal (YES at step S602), then the present process is terminated without carrying out processing for controlling the wafer W temperature.

On the other hand, if the measured temperature profile for the wafer W obtained in step S601 and the reference data are different to one another (NO at step S602), then it is judged that the stage 35 is not adequately thermally transmitting the temperature of the coolant to the wafer W, and hence that ESC drift has arisen in the stage 35; a predetermined alarm (warning screen or warning sound) is outputted to notify a user of this (step S603), and moreover automatic correction processing for carrying out temperature adjustment to stabilize the wafer W temperature at the target temperature is carried out in accordance with a predetermined control program (step S604). In this automatic correction processing, the wafer W temperature is adjusted indirectly by controlling the temperature of the stage 35, or else the wafer W temperature is controlled directly.

In the indirect wafer W temperature adjustment, to control the temperature of the stage 35, at least one control parameter selected from the temperature and flow rate of the coolant supplied into the stage 35 from the chiller unit, and the voltage, current, and electrical power applied to the stage 35 is used. As a result, the effect of the ESC drift that has arisen in the stage 35 can be compensated for. That is, an individual difference for the stage 35, in particular a difference in thermal transmission characteristics between the stage 35 and the wafer W can be eliminated.

On the other hand, in the direct wafer W temperature control, at least one control parameter selected from the temperature, flow rate, pressure, and type of the backside gas supplied onto the rear surface of the wafer W is used. Regarding controlling the type of the backside gas, for example the backside gas can be changed from helium to nitrogen. Because the backside gas is supplied independently toward each of the central portion and the peripheral portion of the wafer W, by supplying a backside gas of a suitable temperature, flow rate, pressure, and type for each of the central portion and the peripheral portion of the wafer W, the temperatures of the central portion and the peripheral portion of the wafer W can be controlled independently of one another.

After the automatic correction processing has been carried out in step S604, step S601 is returned to; the processing of steps S601 to S604 is repeated until the measured temperature profile for the wafer W obtained in step S601 becomes substantially equal to the reference data.

According to the process of FIG. 6, if the measured temperature profile for the wafer W obtained in step S601 and the reference data are different to one another (NO at step S602), then the automatic correction processing is carried out so as to stabilize the wafer W temperature at the target temperature (step S604). As a result, the processing precision for the plasma processing can be prevented from decreasing, and hence the semiconductor device yield can be improved.

Moreover, in the first substrate temperature control process shown in FIG. 6 described above, the measured temperature profile for the wafer W is compared with the reference data, which is a temperature profile showing temperature changes for the wafer W, i.e. temperature profiles are compared with one another. The temperature of the wafer W tends to change with time. Rather than setting the target temperature to a value that does not change with the passage of time, and adjusting the temperature of the wafer W to match this value, it is thus easier to set the target temperature to a value that changes with the passage of time (i.e. a series of values forming a profile), and make the temperature changes of the wafer W match this profile. As a result, the temperature of the wafer W can easily be matched to each target temperature.

In the above embodiment, the first substrate temperature control process shown in FIG. 6 described above is carried out before commencement of or after processing of a lot of the wafers W in the plasma processing apparatus 10 or during an idle period, but the first substrate temperature control process may also be carried out during the plasma processing.

Moreover, in the first substrate temperature control process shown in FIG. 6 described above, the measured temperature profile for the wafer W is compared with the reference data, which is a temperature profile showing temperature changes for the wafer W. However, instead of comparing temperature profiles with one another, an alternative is to carry out temperature control such that the temperature of the wafer W is constant over a certain time period, and compare wafer W temperatures measured at this time with one another.

Moreover, in the above embodiment, the temperature of the coolant is set to 0° C. However, this temperature is determined considering the change over time in the performance of the chiller unit (i.e. the temperature controlling performance) and so on, and is not limited to the above.

FIG. 7 is a flowchart of a second substrate temperature control process carried out by the control unit 400 appearing in FIG. 2. Again, each time reference data (a first profile) as shown in FIGS. 5A and 5B described above has been stored, and furthermore the plasma processing described above (first plasma processing) has been repeated in the plasma processing apparatus 10 another predetermined number of times or for another predetermined time period (e.g. 20 hours), the present process is carried out with a wafer W attracted to and held on the stage 35 before commencement of or after processing on a lot of the wafers W or during an idle period. The wafer W is preferably a non-product processing substrate (a dummy substrate).

As shown in FIG. 7, first, in step S701, the wafer W is subjected to the varying temperature processing described above. At this time, the control unit 400 converts signals inputted from the amplifier 295 into temperatures, so as to measure the temperatures of the central portion and the peripheral portion of the wafer W in contact with the stage 35. As a result, a measured temperature profile (a second profile) for each of the central portion and the peripheral portion for when carrying out the varying temperature processing on the wafer W is obtained.

Next, in step S702, it is determined whether or not the difference between the measured temperature profile for the wafer W and the reference data as shown in FIGS. 5A and 5B is within a permissible range stipulated by a predetermined upper limit and a predetermined lower limit, i.e. whether or not the temperature of the wafer W has been controlled sufficiently precisely to trace the reference data (target temperatures). If the result of the determination is that the above difference is within the permissible range (YES at step S702), then the present process is terminated without carrying out the recovery plasma processing (second plasma processing) of step S704 described below.

On the other hand, if the above difference is outside the permissible range (NO at step S702), then it is judged that the temperature of the wafer W has not been controlled sufficiently precisely to trace the reference data, and hence that there has been change in ESC drift in the stage 35; a predetermined alarm (warning screen or warning sound) is outputted to notify a user of this (step S703), and after the wafer W has been removed from the chamber 34, recovery plasma processing (second plasma processing) for stabilizing the surface state of the stage 35 is carried out in accordance with a predetermined control program (recovery sequence) (step S704).

The recovery sequence carried out in step S704 will now be described. The details of the recovery sequence vary in accordance with the relationship between the measured temperature profile for the wafer W and the reference data.

Firstly, in the case that the result of the determination in step S702 is that the measured temperature profile for the wafer W exceeds the upper limit of the permissible range, i.e. the measured temperature of the wafer W is higher than the target temperature, as the above recovery plasma processing, low ion energy plasma processing is carried out using a gas having a low specific gravity (a depositing gas) under a high process pressure at a high density. An etching gas such as F(fluorine)-, e.g., $CF_4$—, $NF_3$— and $SF_6$-based gas, as well as Cl(chlorine)-based gas, and o(oxygen)-based gas may also be added as required. The surface of the stage 35 can thus be smoothed down through low ion energy sputtering and chemical reaction with F-type or Cl-type radicals, and furthermore deposit (e.g. CF-type polymer) attached to the surface of the stage 35 that would hinder thermal transmission from the wafer W to the stage 35 can be removed. As a result, the thermal transmission between the stage 35 and the wafer W is improved, and hence the temperature of the wafer W can be reduced. The temperature can thus be made to be the same for each of the wafers W subjected to the plasma processing. The processing precision of the plasma processing can thus be stably reproduced for each of a plurality of the wafers W, and hence the semiconductor device yield can be improved.

Note that when removing the deposit, it is preferable to exhaust the space S in the chamber 34 while carrying out the low ion energy plasma processing described above on the stage 35.

Secondly, in the case that the result of the determination in step S702 is that the measured temperature profile for the wafer W is below the lower limit of the permissible range, i.e. the temperature of the wafer W is lower than the target temperature, as the above recovery plasma processing, high ion energy sputter etching is carried out using a heavy gas having a high specific gravity under a high vacuum at a low density. Deposit and so on attached to the surface of the stage 35 is thus removed, and the surface of the stage 35 is roughened to a suitable extent. As a result, the thermal transmission between the stage 35 and the wafer W is worsened, and hence the temperature of the wafer W can be increased. The temperature can thus be made to be the same for each of the wafers W subjected to the plasma processing. The processing precision of the plasma processing, which has decreased, can thus be improved, and hence the semiconductor device yield can be improved.

After the recovery plasma processing has been carried out in accordance with the recovery sequence, step S701 is returned to; the processing of steps S701 to S704 is repeated until the difference between the measured temperature profile for the wafer W and the reference data is within the permissible range.

According to the process of FIG. 7, if the difference between the measured temperature profile for the wafer W and the reference data is outside the permissible range (NO at step S702), then recovery plasma processing is carried out so as to stabilize the surface state of the stage 35 (step S704). The processing precision of the plasma processing can thus be prevented from decreasing due to ESC drift. As a result, the semiconductor device yield can be improved.

In step S704, the recovery plasma processing carried out in accordance with the recovery sequence is not limited to being carried out once, but rather may be carried out a plurality of times. Moreover, the size of the effect expected each time the recovery plasma processing is carried out, i.e. the processing conditions in the recovery plasma processing, may be changed in accordance with the relationship between the measured temperature profile for the wafer W and the reference data.

Furthermore, in the above embodiment, the first substrate temperature control process shown in FIG. 6 and the second substrate temperature control process shown in FIG. 7 may be carried out in combination. In this case, duplicated processing is preferably omitted.

Moreover, in the processes shown in FIGS. 6 and 7 described above, the timing at which the alarm processing is carried out may be changed, or the carrying out of the alarm processing may be omitted.

FIG. 8 is a diagram schematically showing the construction of the system controller for the plasma processing apparatus 10 shown in FIG. 1.

As shown in FIG. 8, the system controller has an EC (equipment controller) 100, a plurality of, for example three, MC's (module controllers) 101, 102, and 103, and a switching hub 104 that connects the EC 100 to each of the MC's 101, 102, and 103. The EC 100 of the system controller is connected via a LAN (local area network) 105 to a PC 106, which is an MES (manufacturing execution system) that carries out overall control of the manufacturing processes in the manufacturing plant in which the plasma processing apparatus 10 is installed. In collaboration with the system controller, the MES feeds back real-time data on the processes in the manufacturing plant to a basic work system (not shown), and makes decisions relating to the processes in view of the overall load on the manufacturing plant and so on.

The EC 100 is a master controller that controls the MC's 101, 102, and 103 and carries out overall control of the operation of the plasma processing apparatus 10. The EC 100 has a CPU, a RAM, an HDD and so on. The CPU sends control signals to the MC's 101, 102, and 103 in accordance with programs corresponding to wafer W processing method menus, i.e. recipes, specified by a user or the like, thus controlling the operations of the plasma processing apparatus 10, and modules such as a TM (transfer module) and an LM (loader module) that may be connected to the plasma processing apparatus 10.

The switching hub 104 selects at least one connection among the connections between the EC 100 and the MC's in accordance with the control signals from the EC 100.

The MC's 101, 102, and 103 are controllers that control the operations of the plasma processing apparatus 10 and the modules. Each of the MC's 101, 102, and 103 has a CPU, a RAM, an HDD and so on, and sends control signals to end devices, described below. Note that for controlling the plasma processing apparatus 10 and the modules, the actual number of MC's possessed by the system controller of the plasma processing apparatus 10 corresponds to the number of modules plus the plasma processing apparatus 10, but in FIG. 8 three MC's are shown for convenience.

Each of the MC's 101, 102, and 103 is connected respectively to an I/O (input/output) module 109, 110 or 111 through a DIST (distribution) board 107 via a GHOST network 108. Each GHOST network 108 is a network that is realized through an LSI known as a GHOST (general high-speed optimum scalable transceiver) on an MC board of the corresponding MC. A maximum of 31 I/O modules can be connected to each GHOST network 108; with respect to the GHOST network 108, the MC is the master, and the I/O modules are slaves.

The I/O module 109 is comprised of a plurality of I/O units 112 that are connected to component elements (hereinafter referred to as the "end devices") of the plasma processing apparatus 10, and transmits control signals to the end devices and output signals from the end devices. Examples of the end devices connected to the I/O units 112 of the I/O module 109 are component elements of the plasma processing apparatus 10 such as the DC power source 45, the APC valve 64, the TMP 66, and the DP 38.

Each of the I/O modules 110 and 111 has a similar construction to the I/O module 109, and hence description thereof is omitted.

Each GHOST network 108 is also connected to an I/O board (not shown) that controls input/output of digital signals, analog signals and serial signals to/from the I/O units 112.

In the plasma processing apparatus 10, when carrying out plasma processing such as RIE or ashing, WLDC, or the first or second substrate temperature control process described above, the CPU of the EC 100 sends control signals to the end devices of the plasma processing apparatus 10 via the switching hub 104, the MC 101, the GHOST network 108, and the I/O units 112 of the I/O module 109, in accordance with a program corresponding to the process in question.

According to the system controller shown in FIG. 8, the plurality of end devices are not directly connected to the EC 100, but rather the I/O units 112 which are connected to the plurality of end devices are modularized to form the I/O modules 109, 110, and 111, and each I/O module 109, 110, or 111 is connected to the EC 100 via the MC 101, 102, or 103 and the switching hub 104. As a result, the communication system can be simplified.

Moreover, each of the control signals sent by the CPU of the EC 100 contains the address of the I/O unit 112 connected to the desired end device, and the address of the I/O module containing that I/O unit 112. The switching hub 104 thus refers to the address of the I/O module in the control signal, and then the GHOST of the appropriate MC 101, 102, or 103 refers to the address of the I/O unit 112 in the control signal, whereby the need for the switching hub 104 or the MC 101, 102, or 103 to ask the CPU for the destination of the control signal can be eliminated, and hence smoother transmission of the control signals can be realized.

Moreover, the MC 101 monitors the plasma processing apparatus 10 via the GHOST network 108 and the I/O units 112 of the I/O module 109 during each of the processes, and in the case of detecting a predetermined error condition, sends an interlock (I/L) signal to the EC 100 via the switching hub 104 to notify the EC 100 to prohibit subsequent transfer of wafers W into the plasma processing apparatus 10. Upon receiving the interlock signal, the EC 100 sends a wafer transfer prohibiting signal prohibiting transferring in of wafers W via the switching hub 104 to the MC that controls operation of the TM (the MC 103 in FIG. 8). Upon receiving the wafer transfer prohibiting signal, the MC 103 controls operation of end devices relating to wafer W transfer so as to stop transfer of wafers W into the plasma processing apparatus 10.

In the above embodiment, the system controller shown in FIG. 8 is in the plasma processing apparatus 10 shown in FIG. 1. However, the system controller may instead be in the control unit 400 appearing in FIG. 2.

Furthermore, in the above embodiment, an SLD 210 that emits light of center wavelength 1.55 μm or 1.31 μm and coherence length approximately 50 μm is used as the low-coherence light source. However, the emitted light preferably has a center wavelength anywhere in a range of 0.3 to 20 μm, preferably 0.5 to 5 μm, and a coherence length anywhere in a range of 0.1 to 100 μm, preferably not more than 3 μm. Moreover, instead of the SLD 210, an LED, a high intensity lamp such as a tungsten lamp or a xenon lamp, or an ultra-wide wavelength band light source may be used.

Moreover, in the above embodiment, the PD 280 is comprised of a Ge photodiode, but instead of this, a Si photodiode, an InGaAs photodiode, an avalanche photodiode, or a photo-electric multiplier tube may be used. Furthermore, in the above embodiment, the motor-driven stage 272 uses a stepping motor, but instead of this, a voice coil motor may be used.

Moreover, note that the temperature measuring apparatus is not limited to those mentioned above, but any apparatus enabling the temperature of the object to be measured may be used.

Furthermore, in the above embodiment, the substrate processing apparatus is an etching apparatus. However, the substrate processing apparatus is not limited thereto, but rather may instead be a CVD (chemical vapor deposition) apparatus, a PVD (physical vapor deposition) apparatus, or the like. Moreover, in the above embodiment, the substrates processed are semiconductor wafers W. However, the substrates processed are not limited thereto, but rather may instead be, for example, LCD (liquid crystal display) or FPD (flat panel display) glass substrates.

Moreover, it is to be understood that the object of the present invention may also be accomplished by supplying a computer such as the EC 100 or the control unit 400 with a storage medium in which is stored a program code of software that realizes the functions of the above embodiment, and then causing a CPU of the computer to read out and execute the program code stored in the storage medium.

In this case, the program code itself read out from the storage medium realizes the functions of the above embodiment, and hence the program code and the storage medium in which the program code is stored constitute the present invention.

Examples of the storage medium for supplying the program code include a floppy (registered trademark) disk, a hard disk, a magnetic-optical disk, an optical disk such as a CD-ROM, a CD-R, a CD-RW, a DVD-ROM, a DVD-RAM, a DVD-RW or a DVD+RW, a magnetic tape, a nonvolatile memory card, and a ROM. Alternatively, the program code may be downloaded via a network.

Moreover, it is to be understood that the functions of the above embodiment may be accomplished not only by executing a program code read out by the CPU of a computer, but also by causing an OS (operating system) or the like which operates on the CPU of the computer to perform a part or all of the actual operations based on instructions of the program code.

Furthermore, it is to be understood that the functions of the above embodiment may also be accomplished by writing a program code read out from a storage medium into a memory provided on an expansion board inserted into a computer or in an expansion unit connected to the computer and then causing a CPU or the like provided on the expansion board or in the expansion unit to perform a part or all of the actual operations based on instructions of the program code.

What is claimed is:

1. A stage onto which is electrostatically attracted a substrate to be processed in a substrate processing apparatus, the stage comprising:
   a temperature measuring unit that measures a temperature of the substrate to be processed using interference of low-coherence lights;
   a temperature adjusting unit that carries out temperature adjustment on the substrate to be processed such as to become equal to a target temperature based on a preset parameter; and
   a substrate temperature controlling unit that controls the temperature of the substrate to be processed by controlling the temperature adjustment by said temperature adjusting unit based on a measured temperature measured by said temperature measuring unit.

2. A stage as claimed in claim 1, wherein the target temperature comprises a temperature profile showing temperature changes over a predetermined time period.

3. A stage as claimed in claim 1, wherein said substrate temperature controlling unit adjusts the parameter when the measured temperature is different to the target temperature.

4. A stage as claimed in claim 1, further comprising an alarm output unit that outputs a predetermined alarm when the measured temperature is different to the target temperature.

5. A stage as claimed in claim 1, wherein the parameter comprises at least one selected from control parameters comprising a temperature and a flow rate of a coolant supplied into the stage, a voltage, a current, and an electrical power supplied to the stage, and a temperature, a flow rate, a pressure, and a type of a heat-transmitting gas supplied onto a rear surface of the substrate to be processed.

6. A stage as claimed in claim 1, wherein said substrate temperature controlling unit separately controls a temperature of each of a central portion and a peripheral portion of the substrate to be processed.

7. A substrate processing apparatus having a stage as claimed in claim 1.

8. A plasma processing apparatus having a stage onto which is electrostatically attracted a substrate to be processed that is to be subjected to first plasma processing, the plasma processing apparatus comprising:
   a varying temperature processing unit that carries out varying temperature processing involving changing a temperature of the substrate to be processed;
   a temperature measuring unit that measures the temperature of the substrate to be processed;
   a storage unit that stores in advance a first profile relating to the temperature of the substrate to be processed measured when carrying out the varying temperature processing on the substrate to be processed after the first plasma processing has been carried out a first predetermined number of times or for a first predetermined time period;
   a comparing unit that comparing the first profile with a second profile relating to the temperature of the substrate to be processed measured when carrying out the varying temperature processing on the substrate to be processed after the first plasma processing has been carried out a second predetermined number of times or for a second predetermined time period; and
   stage recovery unit that carries out second plasma processing on the stage in accordance with results of the comparison.

9. A plasma processing apparatus as claimed in claim 8, wherein said stage recovery unit carries out the second plasma processing on the stage when a difference between the first profile and the second profile not is within a permissible range.

10. A plasma processing apparatus as claimed in claim 8, wherein said stage recovery unit carries out processing of roughening a surface of the stage onto which the substrate to be processed is attracted as the second plasma processing when the second profile is lower than the first profile.

11. A plasma processing apparatus as claimed in claim 8, wherein said stage recovery unit carries out processing of smoothing a surface of the stage onto which the substrate to be processed is attracted as the second plasma processing when the second profile is higher than the first profile.

12. A plasma processing apparatus as claimed in claim 8, further having an alarm output unit that outputs a predetermined alarm in response to a difference between the first profile and the second profile not being within a permissible range.

13. The stage as claimed in claim 1, further comprising:
   a diode that emits low-coherence light;
   a coupler that divides the low-coherence light into first and second light beams,
   wherein the temperature measuring unit measures interference between a reflection of the first light beam and a reflection of the second light beam.

14. The stage as claimed in claim 13, wherein the reflection of the first light beam is a reflection from the substrate.

15. The stage as claimed in claim 14, further comprising:
   an adjustable mirror, wherein the reflection of the second light beam is a reflection from the adjustable mirror.

* * * * *